(12) United States Patent
Juds et al.

(10) Patent No.: US 6,271,656 B1
(45) Date of Patent: Aug. 7, 2001

(54) ELECTRICAL CURRENT SENSING APPARATUS

(75) Inventors: Mark Allan Juds, New Berlin; Kurt Von Eckroth, Oconomowoc; Charles Joseph Tennies, Wuakesha; James Edward Hansen, Oak Creek; Mark George Solverson, Oconomowoc; Jerome Kenneth Hastings, Sussex; Scott Reid, Brookfield, all of WI (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 09/368,050

(22) Filed: Aug. 3, 1999

(51) Int. Cl.$^7$ .................................................. G01R 33/00
(52) U.S. Cl. ................................. 324/117 R; 324/117 H
(58) Field of Search .......................... 324/117 H, 117 R, 324/126, 127, 251, 252; 338/32 H

(56) References Cited

U.S. PATENT DOCUMENTS

| | | |
|---|---|---|
| 3,234,461 | 2/1966 | Trent et al. . |
| 4,506,214 | 3/1985 | Lienhard et al. . |
| 4,599,564 * | 7/1986 | Kelleher et al. ..................... 324/251 |
| 4,616,207 | 10/1986 | Knapp, Jr. et al. . |
| 4,794,326 | 12/1988 | Friedl . |
| 5,041,780 * | 8/1991 | Rippel ............................. 324/117 H |
| 5,172,052 | 12/1992 | Wells . |
| 5,416,407 | 5/1995 | Drafts . |
| 5,615,075 | 3/1997 | Kim . |
| 5,917,401 | 6/1999 | Smith et al. . |

* cited by examiner

*Primary Examiner*—Vinh P. Nguyen
(74) *Attorney, Agent, or Firm*—Tarolli, Sundheim, Covell, Tummino & Szabo L.L.P.

(57) ABSTRACT

An electrical current sensing apparatus includes a magnetic flux sensor which may be disposed adjacent to or within an opening in a conductor. The magnetic flux sensor may be disposed adjacent to a corner of the opening around which magnetic flux resulting from a current conducted through the conductor tends to concentrate. The magnetic flux sensor includes a Hall effect device having a flux sensitive surface. In one embodiment, the conductor has a tubular cylindrical side wall with an opening in which the magnetic flux sensor is disposed. In another embodiment, the conductor has a rectangular configuration with an opening in which the magnetic flux sensor is disposed. In another embodiment, the magnetic flux sensor is mounted on the surface of the conductor adjacent to the opening.

10 Claims, 4 Drawing Sheets

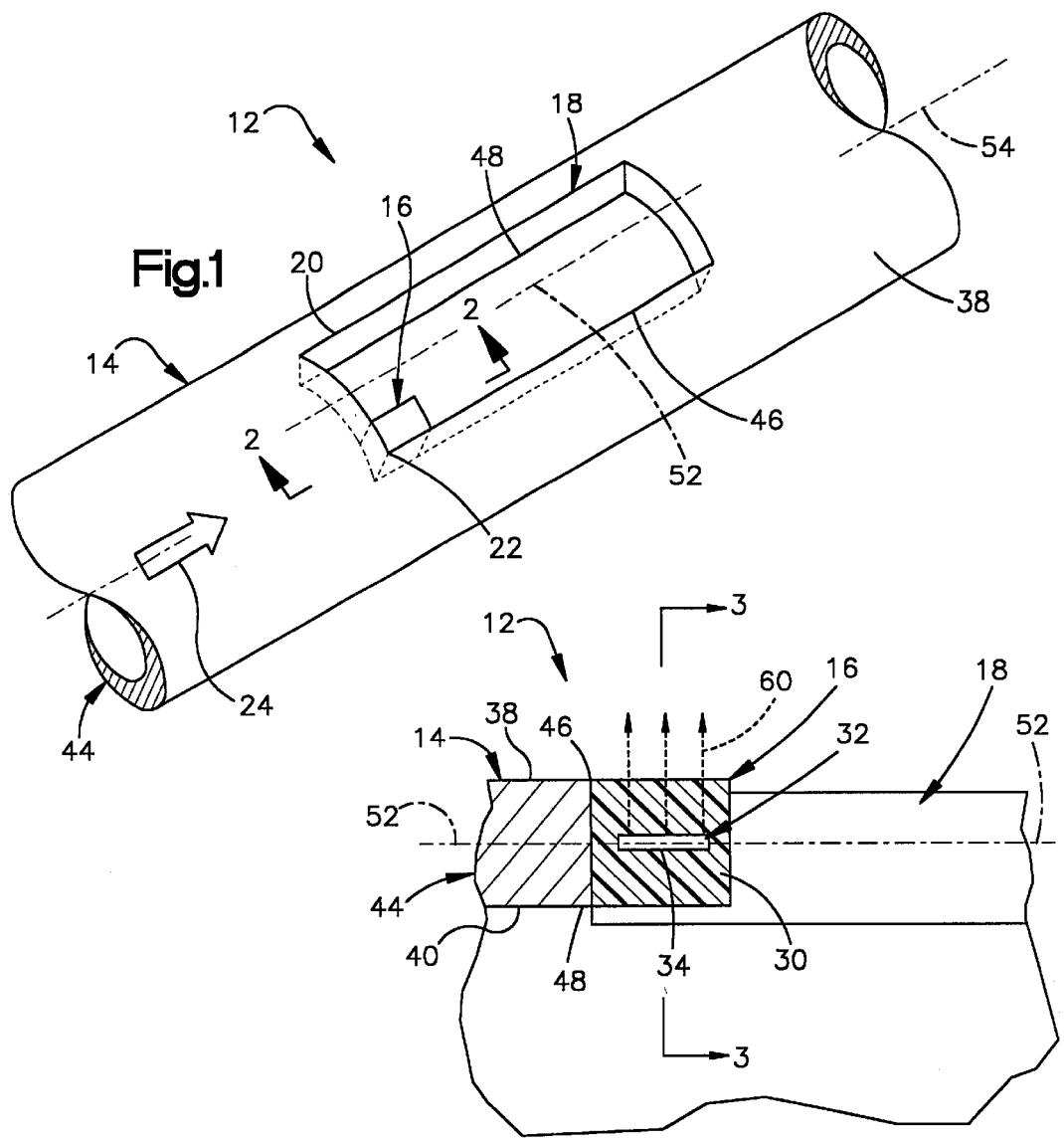
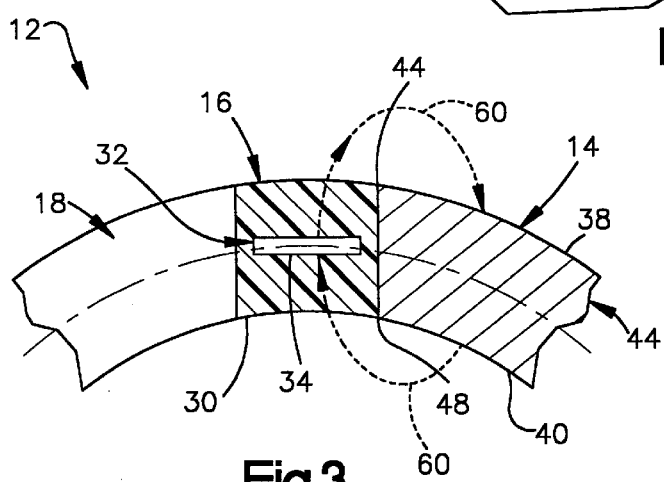
Fig.1
Fig.2
Fig.3

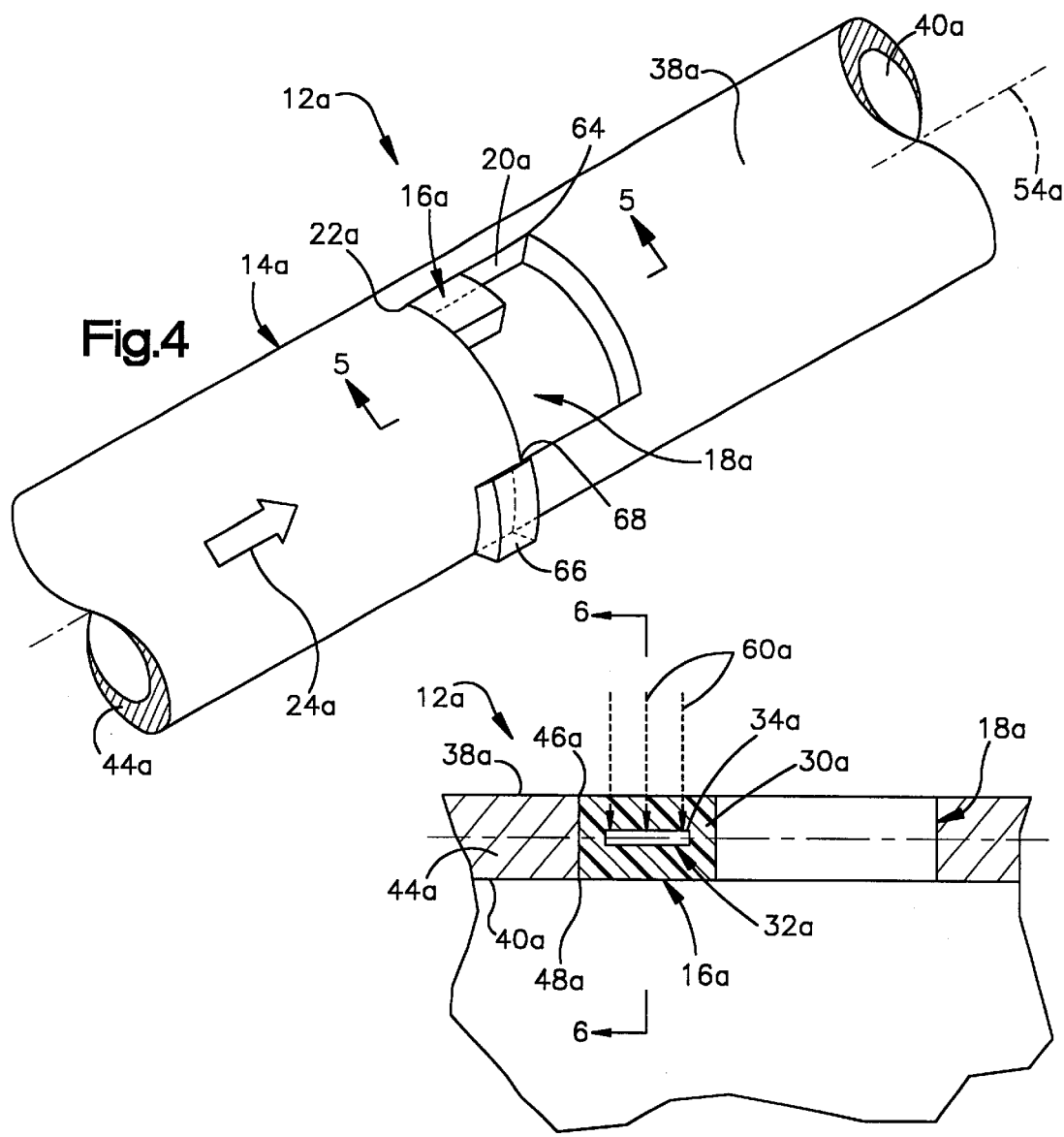
Fig.4
Fig.5
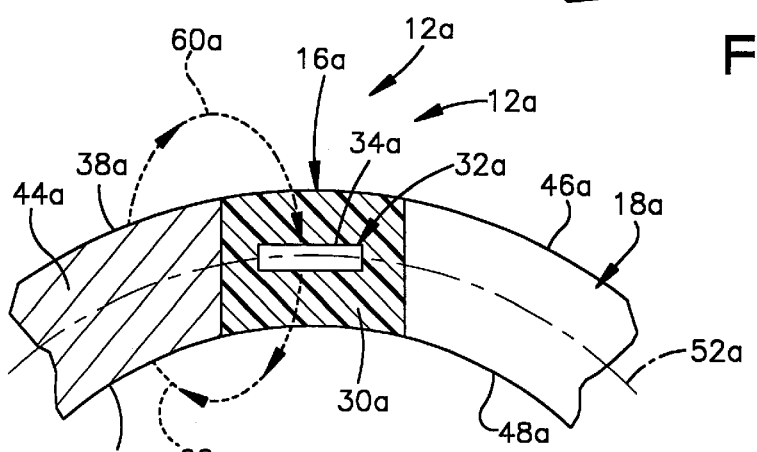
Fig.6

ELECTRICAL CURRENT SENSING APPARATUS

BACKGROUND OF THE INVENTION

The present invention relates to an apparatus which senses an electrical current in a conductor and includes a magnetic flux sensor.

Hall effect devices have been used to sense variations in magnetic flux resulting from a flow of current through a conductor. Some of these known devices have used a flux concentrator to concentrate magnetic flux produced around the flow of current through the conductor. It has previously been suggested that an electrical current sensing apparatus could be constructed in the manner disclosed in U.S. Pat. Nos. 4,616,207 and 5,416,407.

SUMMARY OF THE INVENTION

The present invention provides an electrical current sensing apparatus which includes a magnetic flux sensor. The magnetic flux sensor is disposed within or adjacent to an opening formed in a conductor of electrical current. A variation in the flow of current through the conductor varies the flux to which the magnetic flux sensor is exposed.

BRIEF DESCRIPTION OF THE DRAWINGS

The foregoing and other features of the present invention will become more apparent upon a consideration of the following description taken in connection with the accompanying drawings wherein:

FIG. 1 is a schematic pictorial illustration of an electrical conductor having an opening in which a magnetic flux sensor is disposed;

FIG. 2 is a schematic fragmentary sectional view, taken generally along the line 2—2 of FIG. 1, further illustrating the relationship of the magnetic flux sensor to the opening in the conductor;

FIG. 3 is a schematic fragmentary sectional view, taken generally along line 3—3 of FIG. 2;

FIG. 4 is a schematic pictorial illustration of an electrical conductor having an opening in which a magnetic flux sensor is disposed and a second magnetic flux sensor disposed adjacent to the opening;

FIG. 5 is a fragmentary sectional view, taken generally along the line 5—5 of FIG. 4, further illustrating the relationship of the magnetic flux sensor to the opening in the electrical conductor;

FIG. 6 is a fragmentary sectional view, taken generally along the line 6—6 of FIG. 5;

DESCRIPTION OF SPECIFIC PREFERRED EMBODIMENTS OF THE INVENTION

Figure 7:
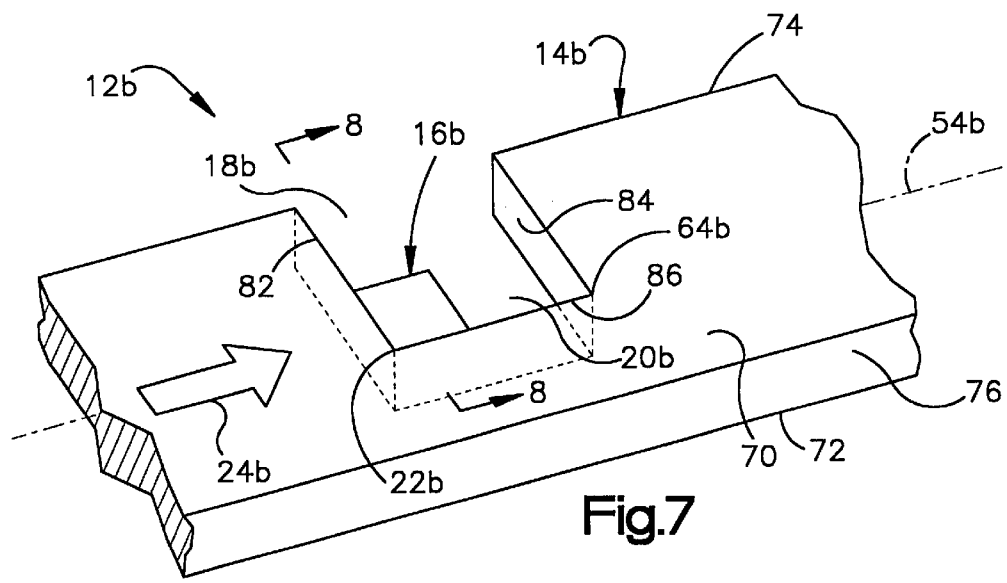
FIG. 7 is a schematic pictorial illustration of an electrical conductor having an opening in which a flux sensor is disposed.

An electrical current sensing apparatus 12 constructed in accordance with the present invention is illustrated in FIGS. 1–3. The electrical current sensing apparatus 12 includes an electrical current conductor 14. In accordance with one of the features of the invention, a magnetic flux sensor 16 is disposed in an opening 18 formed in the electrical current conductor 14. An end portion 20 (FIG. 1) of the opening 18 has a corner portion 22. The magnetic flux sensor 16 is disposed adjacent to corner portion 22.

An electrical current, indicated schematically at 24, is conducted through the electrical conductor 14. The electrical current flows around the opening 18 formed in the electrical current conductor 14. This results in concentrated magnetic flux due to the electrical current 24 being concentrated at the corner portion 22 of the opening 18. By positioning the magnetic flux sensor 16 adjacent to the corner portion 22, the magnetic flux sensor is positioned at a location where the magnetic flux due to the electrical current 24 is concentrated. The magnetic flux sensor 16 provides an output to control circuitry (not shown) indicative of the magnitude of the electrical current 24.

The magnetic flux sensor 16 includes a body 30 (FIGS. 2 and 3) formed of an electrically insulating material. A Hall effect device 32 is supported by the body 30 of electrically insulating material. The Hall effect device 32 has a magnetic flux sensitive surface 34. The Hall effect device 32 responds to magnetic flux which flows through the surface 34. It should be understood that known magnetic flux sensitive devices other than the Hall effect devices 32 could be used to sense the electrical current 24. For example, magnetoresistive devices or other galvanomagnetic effect sensors could be used.

In the embodiment of the invention illustrated in FIGS. 1–3, the electrical current conductor 14 has a tubular cylindrical configuration. Thus, the conductor 14 has a cylindrical outer side surface 38 (FIGS. 2 and 3) which is coaxial with a cylindrical inner side surface 40 of the conductor 14. The opening 18 is formed as a rectangular slot which extends radially through a cylindrical side wall 44 of the electrical current conductor 14. The opening 18 has a rectangular outer edge 46 (FIG. 2) in the outer side surface 38 of the cylindrical side wall 44 and a rectangular inner edge 48 in the inner side surface 40 of the cylindrical side wall 44.

The conductor 14 could have a configuration other than the illustrated cylindrical configuration. Similarly, the opening 18 could have a configuration other than the illustrated rectangular configuration. The opening 18 could extend only part way through the side wall 44 of the conductor 14.

In the illustrated embodiment of the invention, the opening 18 has a longitudinal central axis 52 which extends parallel to a longitudinal central axis 54 (FIG. 1) of the electrical conductor 14. Although the longitudinal central axis 52 of the opening 18 extends parallel to the longitudinal central axis 54 of the conductor 14 in the embodiment of the invention illustrated in FIG. 1, it is contemplated that the longitudinal central axis of the opening 18 could be skewed relative to the longitudinal central axis of the conductor if desired.

The magnetic flux sensor 16 is positioned in the opening 18 with the Hall effect device 32 disposed midway between the outer and inner major side surfaces 38 and 40 of the cylindrical tubular conductor 14 (see FIGS. 2 and 3). The Hall effect device 32 is positioned in the opening 18 with the flux sensitive surface 34 extending parallel to the longitudinal central axis 54 (FIG. 1) of the electrical conductor 14 and to the longitudinal central axis 52 (FIGS. 1 and 2) of the opening 18. This results in the flux sensitive surface 34 extending perpendicular to lines of magnetic flux, indicated schematically at 60 in FIGS. 2 and 3.

The magnetic flux 60 produced by the electrical current 24 being conducted through the conductor 14 is concentrated at the corner portion 22 of the opening 18. The concentrated flux results from the concentration of electrical current near the corner 22 of the opening 18. Since the magnetic flux sensitive surface 34 of the Hall effect device 32 extends perpendicular to the path of flow of the magnetic flux 60, the flow of magnetic flux through the flux sensitive surface of the Hall effect device is maximized.

In the embodiment of the invention illustrated in FIGS. 1–3, the opening 18 has a length which is substantially greater than the length of the magnetic flux sensor 16. However, if desired, the length of the opening 18 could be reduced so as to only be slightly greater than the length of the magnetic flux sensor 16. Although the opening 18 has been illustrated in FIGS. 1–3 as extending radially through a side wall 44 of a tubular conductor 14, the magnetic flux sensor 16 could be disposed in an opening which extends only part way through a conductor having a solid construction. The magnetic flux conducted through the Hall effect device 32 may be maximized by aligning the Hall effect device midway between surfaces 38 and 40 of the electrical conductor 14, and as close to corner 22 as possible.

The magnetic flux sensor 16 is illustrated in FIGS. 1–3 as being disposed in the opening 18. However, the magnetic flux sensor 16 could be disposed on the surface 38 of the conductor 14. For example, the magnetic flux sensor 16 could be mounted on the surface 38 adjacent to the corner portion 22 if desired.

In the embodiment of the invention illustrated in FIGS. 1–3, the magnetic flux sensor 16 is received in an opening 18 which extends along the longitudinal central axis 54 of the conductor. In the embodiment of the invention illustrated in FIGS. 4–6, the magnetic flux sensor 16 is received in an opening which extends circumferentially around the electrical current conductor. Alternatively, the magnetic flux sensor can be mounted on the surface of the conductor adjacent to a corner of the opening. Since the embodiment of the invention illustrated in FIGS. 4–6 is generally similar to the embodiment of the invention illustrated in FIGS. 1–3, similar numerals will be utilized to designate similar components, the suffix letter "a" being associated with the numerals of FIGS. 4–6 to avoid confusion.

An electrical current sensing apparatus 12*a* (FIG. 4) includes an electrical current conductor 14*a*. The electrical conductor 14*a* has a tubular cylindrical side wall 44*a*. A magnetic flux sensor 16*a* is disposed in an opening or slot 18*a* formed in the electrical conductor 14*a*. The opening 18*a* extends circumferentially around a portion of the electrical conductor 14*a*. The magnetic flux sensor 16*a* is disposed adjacent to a corner portion 22*a* at one end portion 20*a* of the opening 18*a*.

An electrical current 24*a* is conducted through the electrical conductor 14*a*. The electrical current 24*a* flows around the opening 18*a*. This results in a concentrated magnetic flux due to the electrical current 24*a* being concentrated around the corner portion 22*a* of the opening 18*a*. By positioning the magnetic flux sensor 16*a* adjacent to the corner portion 22*a* of the opening 18*a*, the amount of magnetic flux to which the sensor is exposed tends to be maximized.

The magnetic flux sensor 16*a* has a rectangular body 30*a* (FIG. 5) formed of an electrically insulating material. A Hall effect device 32*a* is supported by the body 30*a* of electrically insulating material. The Hall effect device 32*a* has a flux sensitive surface 34*a*. The Hall effect device 32*a* responds to magnetic flux which is conducted through the flux sensitive surface 34*a*.

In the embodiment of the invention illustrated in FIGS. 4–6, the electrical conductor 14*a* has a cylindrical tubular configuration. Thus, the electrical current conductor 14*a* has a cylindrical outer side surface 38*a* (FIGS. 4–6) which is disposed in a coaxial relationship with a cylindrical inner side surface 40*a*. The opening 18*a* extends through a cylindrical side wall 44*a* of the electrical current conductor 14*a*. The opening 18*a* extends through the side wall 44*a* and has a rectangular outer edge 46*a* in the outer side surface 38*a* of the side wall 44*a* and a rectangular inner edge 48*a* (FIG. 5) in the inner side surface 40*a* of the side wall 44*a*.

The opening 18*a* has an arcuate central axis 52*a* (FIG. 6) which is disposed midway between the cylindrical inner and outer side surfaces 38*a* and 40*a* of the electrical current conductor 14*a*. The central axis 52*a* of the opening 18*a* extends through the Hall effect device 32*a*. The electrical current conductor 14*a* has a longitudinal central axis 54*a* (FIG. 4) which extends perpendicular to the central axis 52*a* of the opening 18*a* and extends through the center of curvature of the central axis 52*a* of the opening 18*a*. The longitudinal central axis 54*a* of the electrical current conductor 14*a* extends parallel to the flux sensitive surface 34*a* (FIGS. 5 and 6) of the Hall effect device 32*a*.

During the conducting of the current 24*a* through the conductor 14*a*, the current flows around the opening 18*a*. Magnetic flux 60*a* due to the current 24*a* conducted through the conductor 14*a* is concentrated around the corner portion 22*a* of the opening 18*a*. The concentration of magnetic flux will be particularly dense adjacent to the corner portion 22*a* of the opening 18*a*. The magnetic flux 60*a* (FIGS. 5 and 6) travels along a path which extends perpendicular to the flux sensitive surface 34*a* of the Hall effect device 32*a*. Locating the Hall effect device 32*a* in corner portion 22*a* tends to maximize the amount of flux to which the Hall effect sensor 32*a* is exposed.

If desired, the extent of the opening 18*a* along the longitudinal central axis of the conductor 14*a* could be reduced. This would result in the magnetic flux sensor 16*a* being disposed in both the corner portion 22*a* and a corner portion 64 of the opening 18*a*. This would increase the amount of magnetic flux to which the flux sensor is exposed for a given flow of electrical current through the conductor 14*a*.

Alternatively, the flux sensor 66 (FIG. 4) can be mounted on the surface 38*a* of the conductor 14*a* adjacent to a third corner portion 68. Since the electrical current 24*a* and magnetic flux 60*a* resulting from the electrical current are concentrated adjacent to the corner portion 68, the amount of magnetic flux to which the flux sensor 66 is exposed is maximized by mounting the flux sensor adjacent to the corner portion 68.

In the embodiments of the invention illustrated in FIGS. 1–6, the electrical current conductor 14 has a cylindrical tubular configuration. In the embodiment of the invention illustrated in FIGS. 7 and 8, the electrical current conductor has a solid rectangular configuration. Since the embodiment of the invention illustrated in FIGS. 7 and 8 is generally similar to the embodiment of the invention illustrated in FIGS. 1–6, similar numerals will be utilized to designate similar components, the suffix letter "b" being associated with the numerals of FIGS. 7 and 8 to avoid confusion.

An electrical current sensing apparatus 12b (FIG. 7) includes an electrical current conductor 14b. A magnetic flux sensor 16b is disposed in an opening 18b formed in the electrical current conductor 14b. The magnetic flux sensor 16b is disposed adjacent to an end portion 20b and a corner portion 22b of the opening 18b. Electrical current, indicated schematically at 24b in FIG. 7, flows around the opening 18b. This results in magnetic flux being concentrated at the corner portion 22b of the opening 18b.

Figure 8:
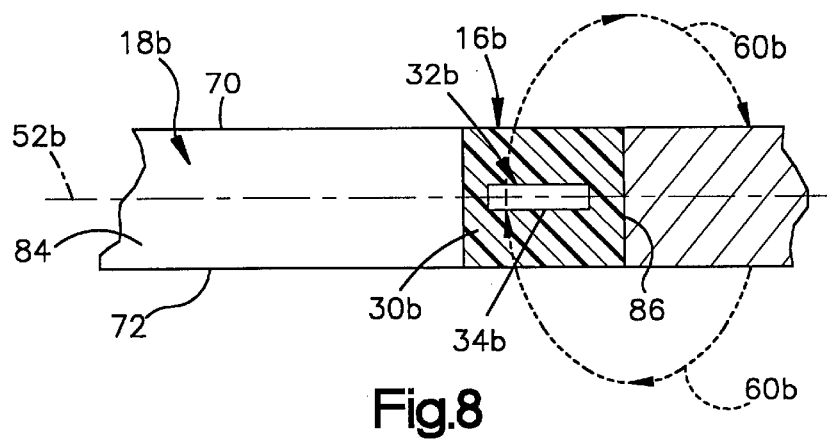
FIG. 8 is a fragmentary sectional view, taken generally along the line 8—8 of FIG. 7, further illustrating the relationship of the magnetic flux sensor to the opening in the electrical conductor.

The electrical current conductor 14b has flat parallel upper and lower major side surfaces 70 and 72 (FIGS. 7 and 8). The upper and lower major side surfaces 70 and 72 extend between flat parallel minor side surfaces 74 and 76 (FIG. 7). The minor side surfaces 74 and 76 extend perpendicular to the major side surfaces 70 and 72 of the electrical current conductor 14b.

The opening 18b extends inward from the minor side surface 74 of the conductor 14b toward the opposite minor side surface 76. Although the opening 18b extends through the conductor 14b, it is contemplated that the opening 18b could extend only part way through the conductor 14b. The opening 18b has a rectangular configuration with parallel opposite side surfaces 82 and 84 which extend perpendicular to the minor side surfaces 74 and 76. An end surface 86 extends between and is perpendicular to the side surfaces 82 and 84. The end surface 86 extends parallel to the minor side surfaces 74 and 76 of the electrical conductor 14b.

The opening 18b has a central axis 52b (FIG. 8) which extends parallel to the major side surfaces 70 and 72 and perpendicular to the end surface 86 of the opening 18b. A longitudinal central axis 54b (FIG. 7) of the electrical current conductor 14b extends perpendicular to and intersects the central axis 52b of the opening 18b.

The magnetic flux sensor 16b (FIG. 8) includes a rectangular body 30b of electrically insulating material. A Hall effect device 32b is supported by the body 30b of electrically insulating material. The Hall effect device 32b has a flux sensitive surface 34b which extends parallel to the major side surfaces 70 and 72 of the conductor 14b. The flux sensitive surface 34b extends perpendicular to the lines 60b of magnetic flux.

When current 24b is conducted through the electrical conductor 14b, magnetic flux, indicated schematically at 60b in FIG. 8, is produced by the electrical current. The magnetic flux 60b is concentrated adjacent to the corner portion 22b (FIG. 7) of the opening 18b. The path along which the magnetic flux 60b flows extends perpendicular to the flux sensitive side surface 34b of the Hall effect device 32b.

In the embodiment of the invention illustrated in FIG. 7, the opening 18b extends from the minor side surface 74 toward the minor side surface 76 so that all of the electrical current 24b flows adjacent to the end portion 20b of the opening 18b. However, it is contemplated that the opening 18b could be formed in a central portion of the electrical conductor 14b if desired. When the opening 18b is formed in the central portion of the conductor 14b, the opening is spaced from the opposite minor side surfaces 74 and 76 of the electrical current conductor 14b. This results in the electrical current 24b flowing around opposite sides of the opening adjacent to the minor side surfaces 74 and 76 of the electrical conductor.

The flux sensor 16b has been illustrated in FIG. 7 as being disposed adjacent to the corner portion 22b and spaced from a second corner portion 64b. If desired, the extent of the opening 18b along the axis 54b could be reduced so that the flux sensor 16b is adjacent to both the corner portion 22b and 64b. This would result in the flux sensor 16b being exposed to magnetic flux concentrations which are present at both the corner portion 22b and the corner portion 64b.

If desired, the flux sensor 16b could be mounted on the major side surface 70 of the conductor 14b adjacent to either the corner portion 22b or the corner portion 64b.

Figure 9:
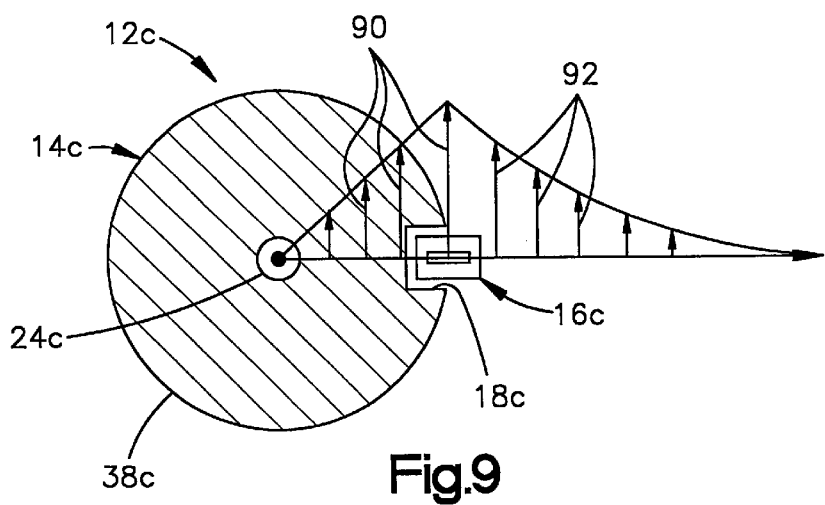
FIG. 9 is a schematic sectional view of an electrical conductor having an opening in which a magnetic flux sensor is disposed, the magnitude of the magnetic flux is illustrated schematically.
Figure 10:
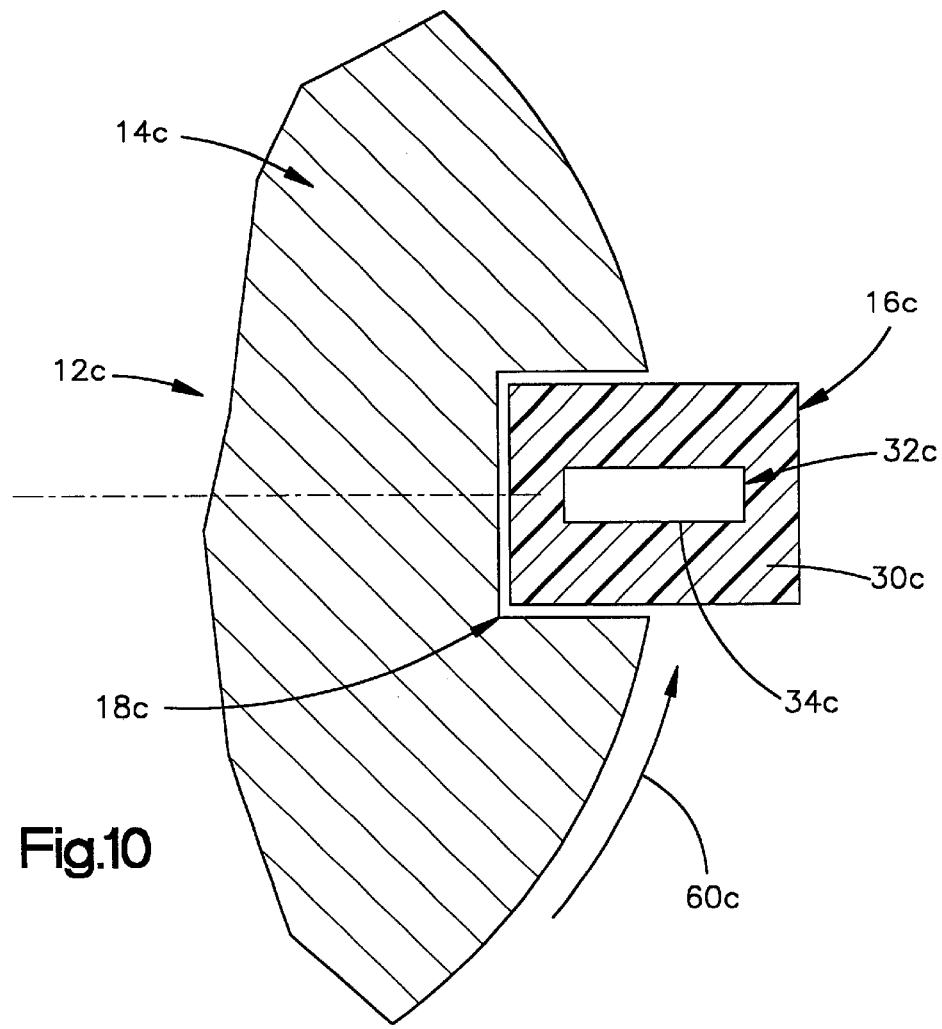
FIG. 10 is an enlarged illustration of a portion of FIG. 9.

In the embodiments of the invention illustrated in FIGS. 1–8, flux sensors 16 and 66 are mounted either in openings in a conductor or on the surface of a conductor. In the embodiment of the invention illustrated in FIGS. 9 and 10, the magnetic flux sensor extends out of an opening in the conductor so that a flux sensitive surface of the sensor extends through and perpendicular to the plane of the exterior surface of the conductor with the center of the flux sensitive surface of a Hall effect device aligned with the conductor surface. Since the embodiment of the invention illustrated in FIGS. 9 and 10 is generally similar to the embodiment of the invention illustrated in FIGS. 1–8, similar numerals will be utilized to designate similar components, the suffix letter "c" being associated with the numerals of FIGS. 9 and 10 to avoid confusion.

An electrical current sensing apparatus 12c (FIG. 9) includes an electrical conductor 14c. The electrical conductor 14c has a cylindrical outer side surface 38c. In the embodiment of the invention illustrated in FIGS. 9 and 10, the conductor 14c is a solid cylindrical conductor through which electrical current, indicated schematically at 24c in FIG. 9, is conducted.

The magnetic flux resulting from the current 24c is zero at the center of the conductor 14c. The magnitude of the magnetic flux increases toward the surface 38c of the electrical conductor 14c in the manner indicated schematically by arrows 90. The magnitude of the magnetic flux resulting from the current 24c is a maximum at the surface 38c of the conductor 14c. The magnitude of the magnetic flux decreases in a direction outward from the surface 38c of the electrical conductor 14c in the manner indicated schematically by arrows 92 in FIG. 9. Therefore, it is advantageous to position a flux sensor 16c (FIG. 10) at a location in which the flux sensor extends through the plane of the cylindrical outer side surface 38c of the conductor 14c.

The magnetic flux sensor 16c includes a body 30c formed of an electrically insulating material. A Hall effect device 32c is supported by the body 30c of electrically insulating material. The Hall effect device 32c has a magnetic flux sensitive surface 34c. The Hall effect device 32c responds to magnetic flux which flows through the surface 34c. It should be understood that known magnetic flux responsive devices other than the Hall effect device 32c could be used to sense the electrical current 24c.

In accordance with a feature of this embodiment of the invention, the Hall effect device 16c is positioned with the center of the magnetic flux sensitive surface 34c disposed in the cylindrical plane containing the cylindrical surface 38c of the conductor 14c. By aligning the center of the flux sensitive surface 34c with the outer side surface 38c of the conductor 14c, the amount of flux, indicated schematically at 60c conducted through the Hall effect device 32c is maximized. This is because the magnitude of the flux 60c is a maximum at the surface 38c of the conductor 14c, in the manner indicated schematically by the arrows 90 in FIG. 9.

To enable the center of the magnetic flux sensitive surface 34c of the Hall effect device 32c to be aligned with the cylindrical outer side surface 38c of the conductor 14c, a portion, approximately one-half, of the magnetic flux sensor 16c is disposed in an opening 18c formed in the conductor 12c. The illustrated opening 18c has a rectangular configuration. However, the opening 18c could have any desired configuration corresponding to the configuration of the magnetic flux sensor 16c.

Figure 11:
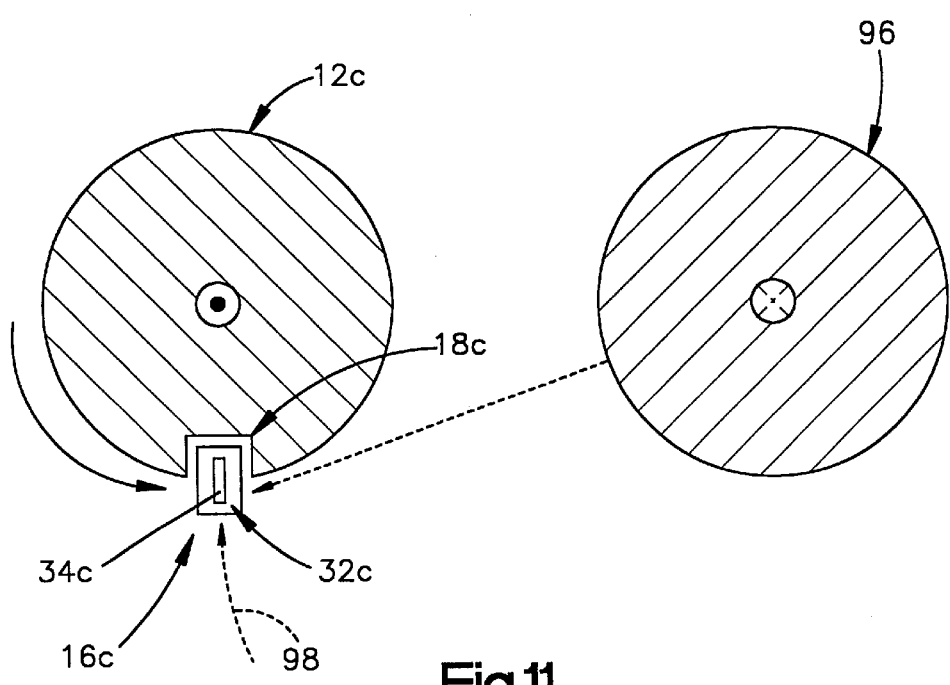
FIG. 11 is a schematic sectional view illustrating the relationship of magnetic flux from an adjacent conductor to the conductor and magnetic flux sensor of FIG. 9.

In order to minimize the effect of extraneous magnetic fields from adjacent conductors, the Hall effect device 32c is positioned in the opening 18c with the plane of the flux sensitive surface 34c extending perpendicular to a plane containing the longitudinal central axis of the conductor 12c and the longitudinal central axis of an adjacent conductor 96 (FIG. 11). By positioning the Hall effect device 32c with the magnetic flux sensitive surface 34c extending perpendicular to the plane containing the longitudinal axes of the conductors 12c and 96, as shown in FIG. 11, magnetic flux from the conductor 96, indicated schematically by the arrow 98 in FIG. 11, has an extremely small component which extends transverse to the magnetic flux sensitive surface 34c of the Hall effect device 32c. This results in the magnetic flux 98 from the current in the conductor 96 having a minimal effect on the output of the Hall effect device 16c. The configuration of the electrical conductors can be any shape and the same principles will apply as described in FIGS. 9, 10, and 11.

In the embodiments of the invention illustrated in FIGS. 1–11, the Hall effect devices 32, 32a, 32b and 32c are connected with suitable control circuitry. When the electrical current being conducted through a conductor 14, 14a, 14b or 14c varies, the magnetic flux to which the Hall effect device is exposed will vary. This results in a variation in the output from the Hall effect device. The control circuitry responds to a variation in the output from the Hall effect device to initiate a suitable control function.

In view of the foregoing description, it is believed to be apparent that the present invention relates to a new and improved electrical current sensing apparatus 12 (FIGS. 1–9) which includes a magnetic flux sensor 16. The magnetic flux sensor 16 is disposed within or adjacent to an opening 18 formed in a conductor 14 of electrical current 24. A variation in the flow of current 24 through the conductor 14 varies the flux 60 to which the magnetic flux sensor 16 is exposed.

The conductor 14 may have a cylindrical (FIGS. 1–6 and 9–11) or a rectangular (FIGS. 7–9) configuration. The opening 18 in the conductor 14 may extend axially along the conductor or extend sideways of the conductor. The conductor 14 may have a tubular construction with a cylindrical side wall 44 to which the magnetic flux sensor 16 is connected. Alternatively, the conductor 14 may have a rectangular configuration with an opening 18 in which the magnetic flux sensor 16 is disposed. The magnetic flux sensor 16 is advantageously disposed adjacent to a corner portion 22 of the opening 18 in the conductor 14 where magnetic flux is concentrated.

Having described the invention, the following is claimed:

1. An electrical current sensing apparatus comprising a hollow conductor having a side wall with inner and outer surfaces, said inner surfaces of said side wall at least partially defines a space within said hollow conductor and said outer surface encloses said inner surface, said side wall defines an opening which extends through said side wall between the space within said hollow conductor and space outside said hollow conductor, said side wall being formed of electrical current conducting material which extends around the opening in said side wall, and a magnetic flux sensor at least partially disposed in the opening in said side wall with the electrical current conducting material extending around said magnetic flux sensor.

2. An apparatus as set forth in claim 1 wherein said magnetic flux sensor is disposed in engagement with the electrical current conducting material which extends around the opening in said side wall.

3. An apparatus as set forth in claim 1 wherein the opening which extends through said side wall includes a plurality of corner portions, said magnetic flux sensor being disposed in one of said corner portions of said plurality of corner portions and being spaced from corner portions of said plurality of corner portions other than said one corner portion.

4. An apparatus as set forth in claim 3 wherein said one of said corner portions is formed by first and second intersecting side surfaces which extend between said inner and outer surfaces of said side wall, said magnetic flux sensor being disposed in engagement with said first and second intersecting side surfaces.

5. An apparatus as set forth in claim 1 wherein inner and outer surfaces of said side wall have a cylindrical configuration and are disposed in a coaxial relationship.

6. An apparatus as set forth in claim 1 wherein said magnetic flux sensor has a flux sensitive surface which is disposed in the opening in said side wall, said magnetic flux sensitive surface being disposed midway between said inner and outer surfaces of said side wall.

7. An apparatus as set forth in claim 1 wherein the opening which extends through said side wall includes at least one corner portion, said magnetic flux sensor being disposed in the one corner portion of the opening, said apparatus further includes a second magnetic flux sensor disposed outside of and offset from the opening which extends through said side wall, said second magnetic flux sensor being disposed along the outer surface of said side wall at a location adjacent to the one corner portion of the opening which extends through said side wall.

8. An apparatus as set forth in claim 1 wherein said magnetic flux sensor includes a Hall effect device which is disposed in said opening at a location between planes containing said inner and outer side surface of said conductor.

9. An electrical current sensing apparatus comprising a tubular conductor having a side wall with cylindrical inner and outer surfaces, said side wall defines a polygonal opening which extends through said side wall between space within said tubular conductor and space outside said tubular conductor at a location between opposite ends of said tubular conductor, and a magnetic flux sensor disposed in one corner portion of a plurality of corner portions of said polygonal opening, said magnetic flux sensor being spaced from corner portions of said polygonal opening other than said one corner portion, said magnetic flux sensor includes a flux sensitive surface which is disposed midway between said cylindrical inner and outer side surfaces of said tubular conductor.

10. An apparatus as set forth in claim 9 further including a second magnetic flux sensor disposed outside of said polygonal opening adjacent to a corner portion of said polygonal opening.

* * * * *